United States Patent [19]
Abe

[11] Patent Number: 6,075,478
[45] Date of Patent: Jun. 13, 2000

[54] ANALOG/DIGITAL CONVERTER WITH THRESHOLD TEST AND CONVERSION MODES

[75] Inventor: Shinichi Abe, Tokyo, Japan

[73] Assignee: Oki Electric Industry, Co., Ltd., Tokyo, Japan

[21] Appl. No.: 09/017,665

[22] Filed: Feb. 3, 1998

[30] Foreign Application Priority Data

Apr. 22, 1997 [JP] Japan .................................... 9-104788

[51] Int. Cl.$^7$ .................................................... H03M 1/12
[52] U.S. Cl. ............................................................ 341/155
[58] Field of Search .................................... 341/155, 161, 341/141

[56] References Cited

U.S. PATENT DOCUMENTS 3,153,142  10/1964  Helleman ................................ 341/165
4,454,500  6/1984   Kato et al. ............................... 341/141

*Primary Examiner*—Howard L. Williams
*Attorney, Agent, or Firm*—Rabin & Champagne, P.C.

[57] ABSTRACT

A successive approximation analog/digital ("A/D") converter that converts an analog input voltage to a digital value for output in a manner enabling a reduction in power consumption. The A/D converter includes a comparator that outputs a referencing result signal by comparing an analog input voltage against a reference voltage. A D/A converter outputs the reference voltage to a comparator in correspondence to a digital voltage signal. A successive approximation register outputs the digital voltage signal to the D/A converter in correspondence to a conversion control signal. A conversion control device outputs the conversion control signal to the successive approximation register in correspondence to the referencing result signal to continue operation of the AND converter until the difference between the analog input voltage and the reference voltage converges to within a specific tolerance range. An output unit holds the digital voltage signal from the successive conversion register at a point in time at which the difference has converged to within the tolerance range and outputs the digital voltage signal as a digital output signal. An operating mode selection circuit judges an effective/non-effective state of the analog input voltage, enables an A/D conversion operation by entering a conversion mode when the analog input voltage is judged to be effective, and disables the A/D conversion operation by entering a standby mode when the analog input voltage is judged to be non-effective.

13 Claims, 2 Drawing Sheets

ANALOG/DIGITAL CONVERTER WITH THRESHOLD TEST AND CONVERSION MODES

BACKGROUND OF THE INVENTION

The present invention relates to a successive approximation analog/digital (hereinafter referred to as "A/D") converter that converts an analog input voltage to a digital value for output and in particular, it relates to such a successive approximation A/D converter which is capable of achieving a reduction in power consumption.

FIG. 2 and 3 show a successive approximation A/D converter in the prior art, with FIG. 2 presenting a schematic block diagram of the converter and FIG. 3 presenting a diagram of an operating waveform thereof.

The A/D converter in FIG. 2 is provided with a comparator 1 that compares an analog input voltage VI to be converted and a reference voltage VR. The analog input voltage VI is input to a + input terminal of the comparator 1. A referencing result signal RE output from the output side of the comparator 1 is input to a conversion control unit 2. The conversion control unit 2 provides control for causing the reference voltage VR to change successively for comparison against the analog input voltage VI and for converting the analog input voltage VI to a digital value, and is provided with a conversion start signal ST which issues a conversion-start instruction in specific cycles and a clock signal CK that constitutes a basis for the operation. The input side of a successive conversion register 3 is connected to the output side of the conversion control unit 2.

The successive conversion register 3 may be a register that holds, for instance, 5-bit data and, in compliance with control provided by the conversion control unit 2, sequentially updates the data from the most significant bit (hereinafter referred to as "MSB") to the least significant bit (hereinafter referred to as "LSB") for output. The input side of a 5-bit digital/analog (hereinafter referred to as "D/A") conversion unit 4 is connected to the output side of the successive conversion register 3. The D/A conversion unit 4 generates a voltage that corresponds to a 5-bit digital input value and outputs it as a reference voltage VR. The output side of this D/A conversion unit 4 is connected to a-input terminal of the comparator 1. In addition, an output unit 5 for holding the final 5-bit value as a digital output signal DO indicating the conversion results for output, is connected to the output side of the successive conversion register 3.

Next, the operation of the A/D converter in the prior art shown in FIG. 2 is explained.

It is assumed that this A/D converter is capable of converting analog input voltages VI ranging from 0 V through 3.1 V in increments of 0.1 V and that 2.3 V is input as the analog input voltage VI.

When the conversion start signal ST and the clock signal CK are provided at the point in time t1 in FIG. 3, processing starts in the conversion control unit 2, and "1" is set as the MSB at the successive conversion register 3 by a conversion control signal CV provided by the conversion control unit 2 with the timing of the clock signal CK at the following point in time t2. In other words, the value of the output signal from the successive conversion register 3 is set to "10000". The output signal from the successive conversion register 3 is provided to the D/A conversion unit 4, and the reference voltage VR1 at the output side of the D/A conversion unit 4 is set to 1.6 V. The analog input voltage VI and the reference voltage VR1 are compared at the comparator 1, and the referencing result signal RE (VI>VR1) is communicated to the conversion control unit 2. With this, while holding the MSB at "1", the conversion control unit 2 sets the next bit (the fourth bit) to "1".

The value of the output signal from the successive conversion register 3 is changed to "11000" by the conversion control signal CV provided by the conversion control unit 2, with the timing of the clock signal CK at the point in time t3. The output signal from the successive conversion register 3 is provided to the D/A converter 4, and the reference voltage VR2 at the output side of the D/A converter 4 is set to 2.4 V (=1.6 V+0.8 V). The analog input voltage VI and the reference voltage VR2 are compared to each other at the comparator 1 and the resulting referencing result signal RE (VI<VR2) is communicated to the conversion control unit 2. With this, while holding the MSB at "1", the conversion control unit 2 sets the next bit (the fourth bit) to "0" and also sets the subsequent bit (the third bit) to "1".

The value of the output signal from the successive conversion register 3 is changed to "10100" by the conversion control signal CV provided by the conversion control unit 2 with the timing of the clock signal CK at the point in time t4. The output signal from the successive conversion register 3 is provided to the D/A converter 4, and the reference voltage VR3 at the output side of the D/A converter 4 is set to 2.0 V (=1.6 V+0.4 V). The analog input voltage VI and the reference voltage VR3 are compared to each other at the comparator 1 and the referencing result signal RE (VI>VR3) is communicated to the conversion control unit 2. With this, while holding the MSB at "1", the fourth bit at "0", and the third bit at "1", the conversion control unit 2 sets the subsequent bit (the second bit) to "1".

Likewise, the value of the output signal from the successive conversion register 3 is changed to "10110" at the point in time t5, and the reference voltage VR4 at the output side of the D/A converter 4 is set to 2.2 V (=1.6 V+0.4 V+0.2 V). The analog input voltage VI and the reference voltage VR4 are compared to each other at the comparator 1 and the referencing result signal RE (VI>VR4) is communicated to the conversion control unit 2. With this, while holding the MSB at "1", the fourth bit at "0", the third bit at "1", and the second bit at "1", the conversion control unit 2 sets the LSB to "1".

The value of the output signal from the successive conversion register 3 is changed to "10111" at the point in time t6, and the reference voltage VR5 at the output side of the D/A converter 4 is set to 2.3 V (=1.6 V+0.4 V+0.2 V+0.1 V).

The analog input voltage VI and the reference voltage VR5 are compared to each other at the comparator 1 and the referencing result signal RE (VI=VR5) is communicated to the conversion control unit 2. With this, while holding the MSB at "1", the fourth bit at "0", the third bit at "1", the second bit at "1", and the LSB at "1", the conversion control unit 2 provides a latch signal LA to the output unit 5 where the digital output from the successive conversion register 3 is held. The output unit 5 then outputs the conversion result as the digital output signal DO.

Then, with the next conversion start signal ST, successive conversion of a new analog input voltage VI is started.

However, A/D converters in the prior art are started up to perform the conversion operation by a conversion start signal ST, which is provided in specific cycles, and since the analog input voltage VI is input only intermittently, a state of no signal is maintained for much of the time and the conversion operation is sustained even during periods of time when the conversion operation is not required. Thus, power is consumed wastefully through the operating currents at the circuits involved in the conversion.

SUMMARY OF THE INVENTION

Accordingly, an object of the present invention which has been completed by addressing the problem of A/D converters in the prior art discussed above, is to provide a new and improved successive approximation A/D converter which is capable of achieving a reduction in power consumption by performing a conversion operation only when the analog input voltage VI is within a preset effective voltage range and by stopping the conversion operation when the analog input voltage VI is outside the effective voltage range.

In order to achieve the object described above, the AND converter according to the present invention comprises a comparator that successively compares an analog input voltage against a reference voltage and outputs a referencing result signal, a D/A converter that outputs the reference voltage to the comparator in correspondence to a digital voltage signal, a successive approximation register that outputs the digital voltage signal to the D/A converter in correspondence to a conversion control signal, a conversion control device that successively outputs the conversion control signal to the successive approximation register in conformance to the referencing result signal to ensure that the difference between the analog input voltage and the reference voltage converges to within a specific tolerance range, an output unit that holds the digital voltage signal from the successive conversion register at the point in time at which the difference has converged to within the tolerance range and outputs it as a digital output signal, and an operating mode selection circuit that makes decisions in regard to the effective/non-effective state of the analog input voltage, enables an AND conversion operation by entering a conversion mode when the analog input voltage is effective, and disables the AID conversion operation by entering a standby mode when the analog input voltage is non-effective.

With this structure, since no A/D conversion operation is performed while the analog input voltage is non-effective, a reduction in power consumption is achieved. In contrast, if the analog input voltage is effective, a normal A/D conversion operation is performed.

Other features of the present invention are disclosed through the independent claims, the attached drawings and the following explanation.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

PREFERRED EMBODIMENT OF THE INVENTION

Figure 1:
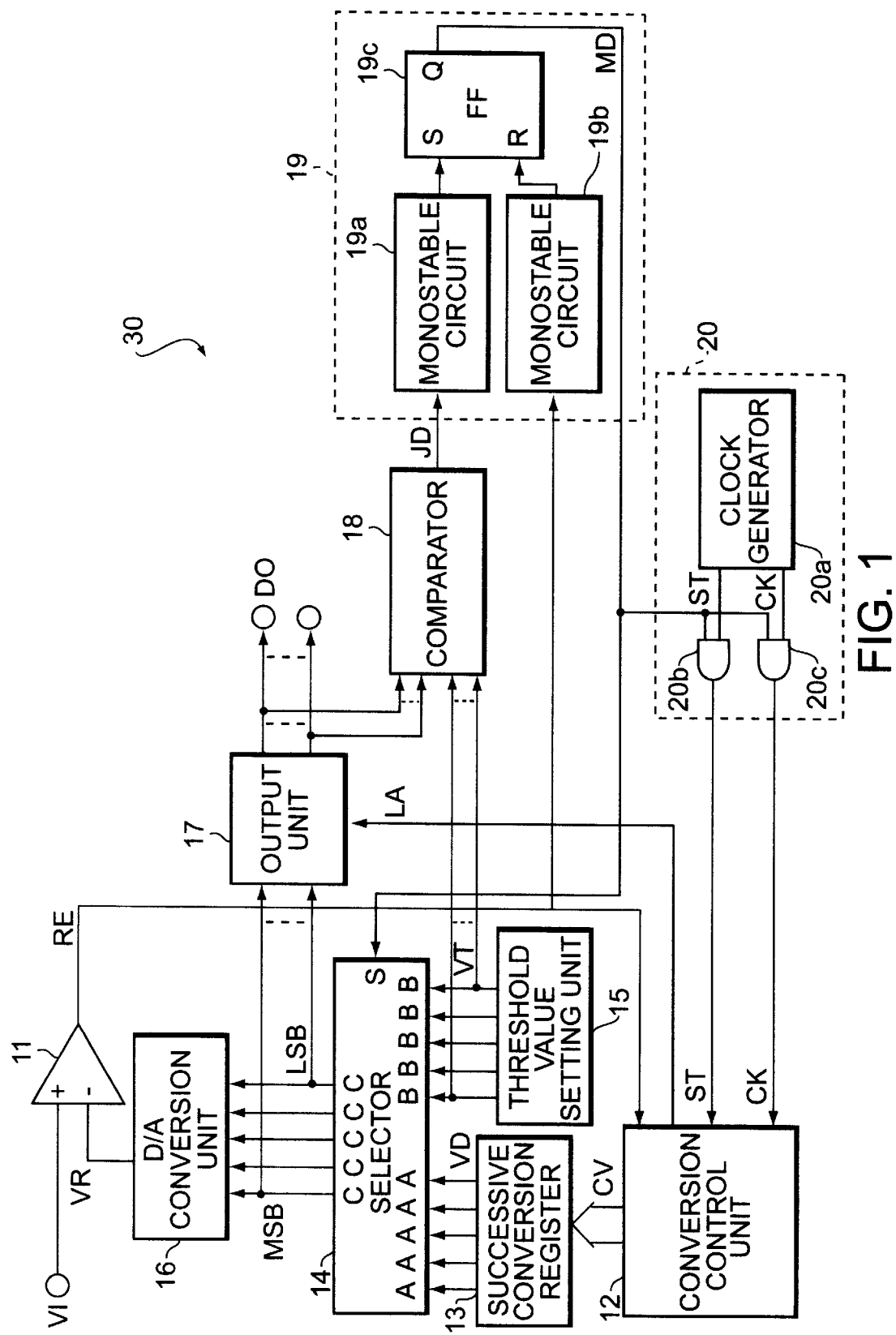
FIG. 1 is a block diagram of the AID converter in an embodiment of the present invention.

FIG. 1 is a block diagram of the successive approximation A/D converter in an embodiment of the present invention.

This A/D converter 10 is provided with a comparator 11 that compares an analog input voltage VI, which is the object of conversion, against a reference voltage VR. The analog input voltage VI is input to a + input terminal of the comparator 11. A referencing result signal RE output through the output side of the comparator 11 is input to a conversion control unit 12. The conversion control unit 12, which is started up by a conversion start signal ST that constitutes an instruction for conversion start, provides control for converting the analog input voltage VI to a digital value by successively changing the reference voltage VR in synchronization with a clock signal CK after comparing it against the analog input voltage VI to converge the difference between the reference voltage VR and the analog input voltage VI to within a specific tolerance range. A conversion control signal CV is output by the conversion control unit 12 and provided to the input side of a successive conversion register 13.

The successive conversion register 13, which may be a register that holds, for instance, 5-bit data, sequentially updates the data from the MSB through the LSB based upon the conversion control signal CV provided by the conversion control unit 12, and outputs the data as a digital voltage signal VD. The output side of the successive conversion register 13 is connected to an input terminal A of a selection unit (for instance, a selector 14).

The selector 14 is provided with an input terminal B that is connected with the output side of a threshold value setting unit 15. The threshold value setting unit 15 is employed to set in advance a threshold value VT which indicates the effective range for the analog input voltage VI, and may be constituted of, for instance, a DIP switch.

The selector 14 is further provided with a selection terminal S, and when an operating mode signal MD provided to the selection terminal S indicates "conversion mode" (logical value "1", for instance), the signal provided to the input terminal A is output to an output terminal C. If, on the other hand, the operating mode signal MD indicates "standby mode" (logical value "0", for instance), the selector 14 outputs the signal provided to the input terminal B to the output terminal C.

In addition, the output terminal C of the selector 14 is connected to the input side of a 5-bit DIA conversion unit 16. The D/A conversion unit 16 generates a voltage that corresponds to the 5-bit digital input value to output it as a reference voltage VR. The output side of the D/A conversion unit 16 is connected to a—input terminal of the comparator 11. Furthermore, an output unit 17 for holding and then outputting the final value as a digital output signal DO indicating the conversion results, is connected to the output side of the selector 14.

The output side of the output unit 17 and the output side of the threshold value setting unit 15 are connected to the input side of a judging unit (a comparator 18, for instance). The comparator 18 compares the digital value of the digital output signal DO output by the output unit 17 and the threshold value VT provided by the threshold value setting unit 15 and outputs the results of the judgment as to whether the analog input signal VI is "effective" or "non-effective" as a judgment signal JD.

The output sides of the comparator 18 and the comparator 11 are connected to the input side of a mode setting unit 19. The mode setting unit 19 comprises monostable multivibrators (hereinafter referred to as "monstable circuits" 19a and 19b) which are connected to the output sides of the comparator 18 and the comparator 11, respectively, and a set/reset type flipflop (hereinafter referred to as "SR-FF" 19c), which is connected to the output sides of the monostable circuits 19a and 19b.

In the mode setting unit 19, a signal with a specific pulse width is output by the monostable circuit 19a to a set terminal S of the SR-FF 19c at a point in time at which the judgement signal JD provided by the comparator 18 shifts from "effective" to "non-effective", thereby setting the operating mode signal MD at the output side of the SR-FF 19c to "standby mode" (="0"). In addition, the mode setting unit 19 is provided with a function whereby a signal with a specific pulse width is output by the monostable circuit 19b to a reset terminal R of the SR-FF 19c at a point in time at which the referencing result signal RE provided by the comparator 11 shifts from "VI<VR" (e.g. "0") to "VI>VR" (e.g. "1") to set the operating mode signal MD at the output side of the SR-FF 19c to "conversion mode" (="1").

The output side of the mode setting unit 19 is connected to the selection terminal S of the selector 14 and is also connected to the input side of an operation control unit 20. The operation control unit 20 is constituted with a clock generator 20a which generates the clock signal CK and the conversion start signal ST, and AND gates (hereinafter referred to as "ANDs" 20b and 20c), which control the output of the clock signal CK and the conversion start signal ST with the operating mode signal MD. The clock signal CK and the conversion start signal ST at the output sides of the ANDs 20b and 20c are both provided to the conversion control unit 12.

Next, the operation performed by the A/D converter shown in FIG. 1 in (I) conversion mode and that performed in (II) standby mode are explained separately.

(I) CONVERSION MODE

When the operating mode signal MD is set to "conversion mode" in the mode setting unit 19, the digital voltage signal VD at the output side of the successive conversion register 13 is selected by the selector 14 and provided to the D/A conversion unit 16. In addition, the clock signal CK and the conversion start signal ST are provided by the operation control unit 20 to the conversion control unit 12.

Figure 2:
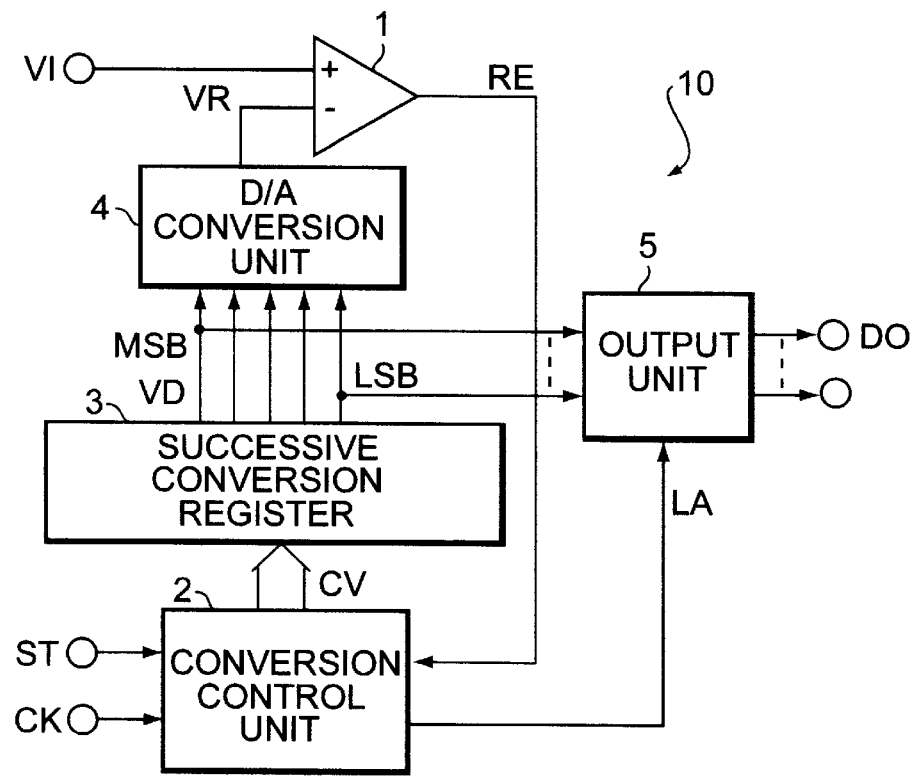
FIG. 2 is a block diagram of an A/D converter in the prior art.
Figure 3:
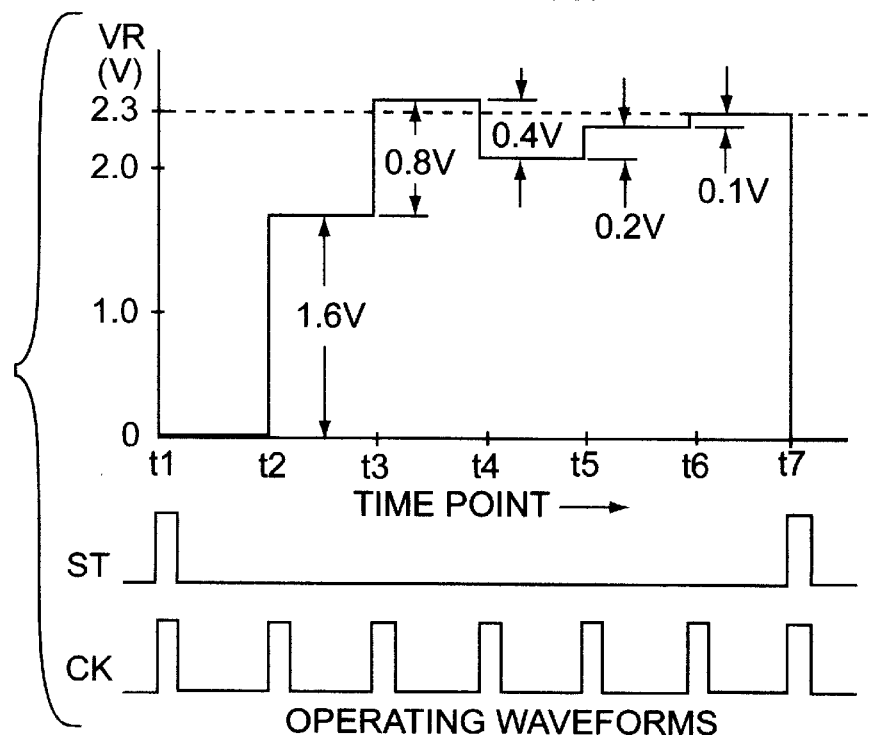
FIG. 3 illustrates the waveforms that represent the operation performed by the A/D converter in the prior art.

The conversion control unit 12 is started up by the conversion start signal ST, and the comparator 11, the conversion control unit 12, the successive conversion register 13, and the D/A conversion unit 16 execute a successive conversion operation one bit at a time in a manner similar to that in which the AND converter in the prior art illustrated in FIGS. 2 and 3 performs the successive conversion operation. With this, the analog input voltage VI input to the comparator 11 is converted to a digital value and is held in the output unit 17 in correspondence to the latch signal LA output by the conversion control unit 12, to be output as a digital output signal DO.

The digital output signal DO is compared with a threshold value VT which is set in advance by the threshold value setting unit 15, at the comparator 18. If the judgment signal JD indicating the comparison result indicates "effective", the operating mode signal MD output by the mode setting unit 19 remains unchanged. In other words, since the "conversion mode" is sustained unchanged, the successive conversion operation is performed repeatedly by the conversion control unit 12 and the like, employing the conversion start signal ST, which is continuously output by the operation control unit 20. This repeated processing in the successive conversion operation is sustained while the digital output signal DO achieved by converting the analog input voltage VI is judged to be "effective".

Now, let us consider a situation in which the analog input voltage VI drops below the threshold value voltage VT. The analog input voltage VI is converted to a digital value and is output from the output unit 17 as the digital output signal DO. In this case, the judgment signal JD indicating the results of the comparison performed by the comparator 18 shifts to "non-effective". With this, the operating mode signal MD at the mode setting unit 19 is set to "standby mode".

(II) STANDBY MODE

When the operating mode signal MD is set to "standby mode", the ANDs 20b and 20c at the operation control unit 20 are closed by this operating mode signal MD. Consequently, no clock signal CK or conversion start signal ST is provided to the conversion control unit 12 and the successive conversion operation is no longer performed. In addition, the threshold value VT at the threshold value setting unit 15 is selected by the selector 14 and is provided to the D/A conversion unit 16. Thus, the reference voltage VR corresponding to the threshold value VT is supplied to the—input terminal of the comparator 11 so that the analog input voltage VI and the threshold value VT can be compared with each other by the comparator 11. During the period of time over which the analog input voltage VI is lower than the threshold value VT, the operating mode signal MD at the mode setting unit 19 remains unchanged, thereby sustaining the "standby mode".

If the analog input voltage VI exceeds the threshold value VT in this state, i.e., if an "effective" analog input voltage VI is input, the referencing result signal RE at the output side of the comparator 11 shifts from "VI<VR" to "VI>VR", thereby setting the operating mode signal MD at the mode setting unit 19 to "conversion mode".

As has been explained, since the A/D converter in this embodiment is provided with the threshold value setting unit 15, the comparator 18, the mode setting unit 19, and the operation control unit 20, if the analog input voltage VI becomes lower than the threshold value VT, "standby mode" is set by the mode setting unit 19 to stop the output of the clock signal CK and the conversion start signal ST from the operation control unit 20. Thus, since the A/D conversion is stopped when the analog input voltage VI is "non-effective", it becomes possible to reduce the power consumption that results from an unnecessary conversion operation. Furthermore, since the analog input voltage VI is monitored by the comparator 11, by selecting the threshold value VT with the selector 14 during the "standby mode", an advantage is achieved in that an "effective" analog input voltage VI can be immediately detected.

While the invention has been particularly shown and described with reference to a preferred embodiment thereof, the A/D converter according to the present invention is not limited to this example, and it will be understood by those skilled in the art that various changes in form and detail may be made therein without departing from the spirit, scope, and teaching of the invention.

For instance, the number of bits in the digital signal at the successive conversion register 13, the D/A conversion unit 16 and the like, is not limited to 5, and a larger number of bits may be employed to achieve a desired level of resolution.

In addition, the threshold value setting unit 15 may be constituted of a component other than a DIP switch (such as a programmable register group) and the threshold value may be set through a program by employing a register or the like, in which case a fixed connection may be used in order to simplify the apparatus. Alternatively, the number of digits at the DIP switch or the like at the threshold value setting unit 15, does not have to be the same as the number of digits at the successive conversion register, and, for instance, the lower order bits may be connected in a fixed manner.

Furthermore, while the comparator 18 judges that the analog input voltage VI is "non-effective" when the digital output signal DO is smaller than the threshold value VT, the "non-effective" judgment may be made when the digital output signal DO is larger than the threshold value VT, depending upon the input requirements of the analog input voltage VI.

Moreover, while the operation control unit 20 is provided with the clock generator 20a for generating the clock signal CK and the conversion start signal ST, the clock signal CK and the like may be provided from the outside.

In addition, the structures of the mode setting unit 19, the operation control unit 20 and the like are not limited to the structural examples shown in FIG. 1, and they may adopt any structure as long as they retain the same functions.

Moreover, while the conversion control unit 12, the successive conversion register 13, the selector 14, the threshold value setting unit 15, the output unit 17, the comparator 18, the mode setting unit 19, the operation control unit 20 and the like are constituted as separate functional blocks, their functions may be achieved through program control performed by a central processing unit (CPU).

As has been explained in detail, according to the present invention, since the threshold value setting unit that sets an effective range for the analog input voltage, the judging unit that makes a judgment in regard to whether or not a digital output signal is in the effective range, the mode setting unit that switches the operating mode between the "standby mode" and the "conversion mode" depending upon the results of the judgment made by the judging unit, and the operation control unit that stops the conversion operation when the standby mode is set, are provided, the conversion operation is stopped if the analog input voltage is not within the effective range, thereby making it possible to reduce power consumption.

The disclosure in Japanese Patent Application No. 9-104788 filed on Apr. 22, 1997, including specifications, claims, drawings, and summary, is incorporated herein by reference in its entirety.

What is claimed is:

1. An A/D converter, comprising:
   a comparator that compares an analog input voltage against a reference voltage to generate a corresponding referencing result signal;
   a D/A converter that provides the reference voltage to the comparator in correspondence to a digital reference signal;
   a successive conversion register that provides the digital reference signal to the D/A converter under control of a conversion control signal;
   a conversion control device that provides the conversion control signal to the successive conversion register in correspondence to the referencing result signal;
   an output unit that holds the digital reference signal received from the successive conversion register and generates the digital reference signal as a digital output signal under control of the conversion control device; and
   an operating mode selection circuit that determines whether the analog input voltage is in a first state or a second state, enables an A/D conversion operation of the analog input voltage by entering a conversion mode when the analog input voltage is determined to be in the first state and disables the A/D conversion operation of the analog input voltage by entering a standby mode when the analog input voltage is determined to be in the second state;
   wherein the operating mode selection circuit includes a threshold value setting unit for setting a predetermined threshold value which indicates a range for which the analog input voltage is determined to be in the first state; and
   wherein the operating mode selection circuit includes a judging unit that compares the digital output signal against the threshold value, judges whether the analog input voltage is in the first state or the second state, based on said comparison, and generates a judgment signal indicating the judged first state or second state state.

2. An A/D converter according to claim 1, wherein the threshold value setting unit includes a DIP switch.

3. An A/D converter according to claim 1, wherein the threshold value setting unit includes a programmable register group.

4. An A/D converter according to claim 1, wherein the operating mode selection circuit includes a mode setting unit, which is responsive to the judgment signal and the referencing result signal to generate the operating mode signal, to be set in the standby mode when the judgment signal shifts from an indication of the first state to an indication of the second state, and to be set to the conversion mode when the referencing result signal indicates that the analog input voltage compares favorably with the reference voltage.

5. An A/D converter according to claim 4, wherein the mode setting unit comprises a first monostable multi-vibrator that receives the judgment signal, a second monostable multi-vibrator that receives the referencing result signal, and a flipflop that generates an operating mode signal indicating the standby mode or the conversion mode in correspondence to outputs from the first monostable multi-vibrator and the second monostable multi-vibrator.

6. An A/D converter according to claim 5, wherein the operating mode selection circuit includes an operation control unit that provides a conversion start signal to the conversion control unit in specific cycles in the conversion mode and inhibits the conversion start signal in the standby mode, responsive to the operating mode signal.

7. An A/D converter according to claim 4, wherein
   the mode setting unit comprises a first monostable multi-vibrator that receives the judgment signal, a second monostable multi-vibrator that receives the referencing result signal, and a flipflop that generates an operating mode signal indicating the standby mode or the conversion mode in correspondence to outputs from the first monostable multi-vibrator and the second monostable multi-vibrator; and
   the selector is further responsive to the operating mode signal to select the digital reference signal or the threshold value.

8. An A/D converter according to claim 1, wherein the operating mode selection circuit includes an operation control unit that provides a conversion start signal to the conversion control unit in specific cycles in the conversion mode and inhibits the conversion start signal in the standby mode.

9. An A/D converter, comprising:
   a comparator that compares an analog input voltage against a reference voltage to generate a corresponding referencing result signal;
   a D/A converter that provides the reference voltage to the comparator in correspondence to a digital reference signal;

a successive conversion register that provides the digital reference signal to the D/A converter under control of a conversion control signal;

a conversion control device that provides the conversion control signal to the successive conversion register in correspondence to the referencing result signal;

an output unit that holds the digital reference signal received from the successive conversion register and generates the digital reference signal as a digital output signal under control of the conversion control device; and an operating mode selection circuit that determines whether the analog input voltage is in a first state or a second state, enables an A/D conversion operation of the analog input voltage by entering a conversion mode when the analog input voltage is determined to be in the first state, and disables the A/D conversion operation of the analog input voltage by entering a standby mode when the analog input voltage is determined to be in the second state;

wherein the operating mode selection circuit includes a threshold value setting unit for setting a predetermined threshold value which indicates a range for which the analog input voltage is determined to be in the first state, wherein the operating mode selection circuit includes a selector that is responsive to an operating mode signal, to select the digital reference signal for provision to the D/A converter in the conversion mode, and to select the threshold value for provision to the D/A converter in place of the digital reference signal in the standby mode, and wherein the operating mode selection circuit includes a judging unit that compares the digital output signal against the threshold value, judges whether the analog input voltage is in the first state or the second state, based on said comparison, and generates a judgment signal indicating the judged first or second state.

10. An A/D converter according to claim 9, wherein the operating mode selection circuit includes a mode setting unit, which is responsive to the judgment signal and the referencing result signal, to be set in the standby mode when the judgment signal shifts from an indication of the first state to an indication of the second state, and to be set to the conversion mode when the referencing result signal indicates that the analog input voltage compares favorably with the reference voltage.

11. An A/D converter according to claim 10, wherein the mode setting unit comprises a first monostable multi-vibrator that receives the judgment signal, a second monostable multi-vibrator that receives the referencing result signal, and a flipflop that generates an operating mode signal indicating the standby mode or the conversion mode in correspondence to outputs from the first monostable multi-vibrator and the second monostable multi-vibrator.

12. An A/D converter according to claim 11, wherein the operating mode selection circuit includes an operation control unit that provides a conversion start signal to the conversion control unit in specific cycles in the conversion mode and inhibits the conversion start signal in the standby mode.

13. An A/D converter, comprising:

a first comparator that compares an analog input voltage against a reference voltage to generate a corresponding referencing result signal;

a D/A converter that provides the reference voltage to the first comparator in correspondence to a digital reference signal;

a selector that selects one of a digital voltage signal and a threshold value and provides the selected one to the D/A converter as the digital reference signal, in correspondence to an operating mode signal;

a successive conversion register that generates the digital voltage signal in correspondence to a conversion control signal, and provides the digital voltage signal to the selector;

a conversion control unit that generates the conversion control signal in correspondence to the corresponding referencing result signal on receipt of a conversion start signal;

a second comparator that compares the digital reference signal with the threshold value, and generates a judgement signal;

an operation control unit that provides the conversion start signal to the conversion control unit in correspondence to the operating mode signal; and a mode setting unit that decides a mode in correspondence to the judgement signal, and provides an indication of the decided mode as the operating mode signal to the selector the operation control unit.

* * * * *